(12) United States Patent
Lopatin et al.

(10) Patent No.: US 11,192,276 B2
(45) Date of Patent: Dec. 7, 2021

(54) METHOD FOR MANUFACTURING A SENSOR ELEMENT OR AN ACTIVE COMPONENT OF A SENSOR ELEMENT

(71) Applicant: Endress + Hauser GmbH + Co. KG, Maulburg (DE)

(72) Inventors: Sergej Lopatin, Lorrach (DE); Dietmar Spanke, Steinen (DE); Peter Klofer, Steinen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 662 days.

(21) Appl. No.: 15/513,212

(22) PCT Filed: Sep. 28, 2015

(86) PCT No.: PCT/EP2015/072254
§ 371 (c)(1),
(2) Date: Mar. 22, 2017

(87) PCT Pub. No.: WO2016/046417
PCT Pub. Date: Mar. 31, 2016

(65) Prior Publication Data
US 2017/0298490 A1    Oct. 19, 2017

(30) Foreign Application Priority Data
Sep. 26, 2014 (DE) .................. 10 2014 114 039.7

(51) Int. Cl.
*B28B 1/00* (2006.01)
*H01L 41/37* (2013.01)
(Continued)

(52) U.S. Cl.
CPC ............ *B28B 1/001* (2013.01); *B29C 70/088* (2013.01); *B29C 70/12* (2013.01); *B33Y 10/00* (2014.12);
(Continued)

(58) Field of Classification Search
CPC ................................ B33Y 10/00; B33Y 80/00
(Continued)

(56) References Cited

U.S. PATENT DOCUMENTS 5,807,448 A * 9/1998 Nakazawa .............. G06F 30/00
156/58
5,818,149 A 10/1998 Safari et al.
(Continued)

OTHER PUBLICATIONS

A. Safari et al., "Solid freeform fabrication of piezoelectric sensors and actuators", Journal of Materials Science, Frontiers of Ferroelectricity, 2006, vol. 41, pp. 177-198.
(Continued)

*Primary Examiner* — Derek J Rosenau
(74) *Attorney, Agent, or Firm* — Christopher R. Powers; Endress+Hauser (USA) Holding Inc.

(57) ABSTRACT

The invention relates to a method for manufacturing a sensor element or an active component of a sensor element. The sensor element is applied in a field device of automation technology. The method comprises the following method steps: predetermining at least two materials with different physical and chemical properties depending on a functionality of the sensor element or the active component of the sensor element; predetermining an outer shape, into which the at least two materials should be formed, the outer shape being divided into a plurality of virtual spatial regions, wherein in each virtual spatial region the material distribution of the at least two materials occurs homogeneously and periodically according to predetermined rules corresponding to a microstructure. The method also includes steps of ascertaining the predetermined rules via a computer supported method depending on the predetermined functionality of the sensor element or the active component of the sensor element.

13 Claims, 4 Drawing Sheets

(51) Int. Cl.
  *H01L 41/00* (2013.01)
  *B33Y 10/00* (2015.01)
  *B33Y 80/00* (2015.01)
  *B29C 70/08* (2006.01)
  *B29C 70/12* (2006.01)
  *B65D 81/02* (2006.01)
  *C22C 47/06* (2006.01)
  *C22C 47/20* (2006.01)
  *D04H 1/4242* (2012.01)
  *G05D 23/24* (2006.01)
  *H01C 7/02* (2006.01)

(52) U.S. Cl.
  CPC .............. *B33Y 80/00* (2014.12); *B65D 65/44* (2013.01); *C22C 47/068* (2013.01); *C22C 47/20* (2013.01); *D04H 1/4242* (2013.01); *G05D 23/2451* (2013.01); *H01C 7/022* (2013.01); *H01L 41/00* (2013.01); *H01L 41/37* (2013.01)

(58) Field of Classification Search
  USPC ........................................................ 700/119
  See application file for complete search history.

(56) References Cited

U.S. PATENT DOCUMENTS

| | | | |
|---|---|---|---|
| 6,049,160 A | 4/2000 | Safari et al. | |
| 2004/0173946 A1* | 9/2004 | Pfeifer | B33Y 10/00 264/497 |
| 2007/0087564 A1* | 4/2007 | Speakman | H01M 10/0436 438/674 |
| 2010/0200898 A1* | 8/2010 | Lin | H01L 27/14618 257/294 |
| 2016/0059489 A1* | 3/2016 | Wang | G06F 30/00 700/119 |
| 2016/0075087 A1* | 3/2016 | Manners | B33Y 30/00 700/98 |
| 2016/0151977 A1* | 6/2016 | Burd | B33Y 10/00 700/98 |

OTHER PUBLICATIONS

International Search Report, EPO, The Netherlands, dated Jan. 7, 2016.

* cited by examiner a) b) c)

US 11,192,276 B2

METHOD FOR MANUFACTURING A SENSOR ELEMENT OR AN ACTIVE COMPONENT OF A SENSOR ELEMENT

TECHNICAL FIELD

The invention relates to a method for manufacturing a sensor element or an active component of a sensor element. Preferably, the sensor element is applied in a field device of automation technology.

BACKGROUND DISCUSSION

Field devices of automation technology register or monitor process variables of media, e.g. media located in tanks, pipelines or channels. For registering a process variable, the field device has a suitable sensor element. Associated with the sensor element is a control/evaluation unit. As a function of the process variable, the sensor element delivers an electrical output signal, which is supplied to the control/evaluation unit. Sensors register, for example, fill level, density, viscosity, moisture, concentration, composition, flow, pressure, temperature, analytical data, such as pH-value, turbidity or conductivity of a medium. Corresponding field devices are sold by the E+H group of companies in the most varied of embodiments. Moreover, sensor elements can also be integrated in actuators, such as e.g. valves or pumps. In general, sensor elements can be components of a variety of field devices, wherein field devices refers, in a broad sense, to all devices, which are applied near to the process and which deliver, or process, process relevant information.

SUMMARY OF THE INVENTION

An object of the invention is to provide a method for manufacturing a sensor element or an active component of a sensor element optimized relative to physical properties.

The object is achieved by the method described in the following in greater detail, namely a method for manufacturing a sensor element or an active component of a sensor element, wherein the sensor element is applied in a field device of automation technology, wherein at least two materials with different physical and chemical properties are predetermined depending on a functionality of the sensor element or the active component of the sensor element, wherein an outer shape, into which the at least two materials should be formed, is predetermined, wherein the outer shape is divided into a plurality of virtual spatial regions, wherein in each virtual spatial region the material distribution of the at least two materials occurs homogeneously and periodically according to predetermined rules, wherein the predetermined rules are ascertained via a computer supported method depending on the predetermined functionality of the sensor element or the active component of the sensor element, wherein digital data, which describe the ascertained material distribution, are transferred to at least one 3D printer, and wherein a printed product is created by the 3D printer based on the digital data.

In principle, any composite material with exactly defined properties can be printed via the method of the invention. Then, the printed composite material can be formed into the appropriate shape for the sensor element or the active components of the sensor element by e.g. a mechanical working process.

Preferably, the method of the invention is utilized, in order to manufacture a composite material. Especially, the composite material is a piezoelectric material, which is formed preferably in disk shape and is used as exciter/receiving unit for an oscillatory system of a vibronic sensor or an ultrasonic transducer. In such case, the dimensions of the outer shape of the printed sensor element, or the component of the sensor element, as the case may be, are selected significantly larger than the dimensions of a virtual spatial region. The dimensions of every virtual spatial region are so selected that the physical behavior, i.e. the physical properties, of the sensor element, or the active component of the sensor element, are present there. Or, in other words: in each virtual spatial region, the physical behavior, i.e. the physical properties, of the individual components of the composite material is/are replaced by the desired physical behavior, i.e. the desired physical properties, of the composite material. The ascertaining of the homogeneous and periodic microstructure of the at least two materials in the virtual spatial region occurs preferably via the FEM (finite elements model) method. The ascertained virtual spatial region is repeatedly printed, until the desired outer shape of the composite material, the sensor element or the active component of the sensor element is present.

The class of the heterogeneous materials includes composite materials. These are composed of at least two phases, or at least two materials, wherein the phases-, or the material properties, of the at least two materials usually strongly differ from one another. Examples of composite materials include a plastic with glass fibers or a conductive adhesive of epoxide resin with silver particles. These simple, non-textured, composite materials can be won by mixing the materials.

Besides these composites materials, known since the beginning of the 1980s are so-called active composite materials, which are used not as construction materials, but, instead, as sensor materials with unique electrical and mechanical properties. For example, they enable a composite technology, i.e. manufacture of composite materials with mechanical and electrical properties not possible with usual materials. Thus, it is especially possible so to amplify the elastic properties in a piezoceramic composite material that it has an extremely high hydroacoustic sensitivity not achievable with traditional piezoelectric materials. An important criterion for a composite material manufactured by means of the method of the invention is that at least one dimension of the microstructure, i.e. of the virtual spatial regions, formed from the at least two materials is significantly less (by at least a factor of 5-10 less) than the dimensions of the outer shape of the manufactured sensor element, or the manufactured component of the sensor element, as the case may be.

The properties of a composite material depend not only on the properties of the individual components, but, instead, also on the manner (connectivity pattern, or connection pattern) of connection between the individual components. This connection pattern is described via the predetermined rules of the invention. Examples of such connection patterns or microstructures include balls, rods, fibers, etc. In principle, arbitrarily complicated microstructures can be created. In this connection, reference is made to the paper "Composite Electroceramics" by R. E. Newham, published in Ferroelectrics, 1986, volume 68, pages 1-32. FIG. 27 of such article shows examples of so-called Connectivity Patterns, which describe the geometry of the two phases in composite electroceramics. Corresponding electroceramics belong in the class of active composite materials.

The properties of an active composite material depend thus not only on the physical and chemical properties of the individual components, but, instead, also on the defined connection pattern, which can be described by clearly defined rules. Composite materials with a connection pattern matched to the functionality of the sensor element or the component of the sensor element can be reproducibly manufactured via the method of the invention. This is only very difficulty or not at all possible with conventional methods—especially when the manufacturing should occur for industrial application.

In an advantageous embodiment of the method of the invention, the dimensions of a virtual spatial region manufactured via 3D printing are so sized that they are less by at least a factor of 5-10, or also by at least two orders of magnitude, than the dimensions of the printed product. If the sensor element, or the component of the sensor element, involves a piezoelectric material, then at least a factor of 5, depending on application, a factor of 10 or also orders of magnitude 1, 2, 3, . . . should be set. Important in connection with the invention is that the dimensioning, or the dimensions, of a virtual spatial region manufactured via 3D printing should be selected at least sufficiently large that the physical and chemical properties of the composite material in the virtual spatial region correspond to the physical and/or chemical properties of the sensor element or the active component of the sensor element. The physical and/or chemical properties of the at least two individual materials are replaced by the properties of the composite material. This virtual spatial region is multiplied by the 3D printer until the outer dimensions of the sensor element, or the active component of the sensor element, or the composite material, as the case may be, are achieved. According to the invention, it is sufficient, thus, for the purpose of creating a desired composite material to establish the dimensions and the microstructure of a virtual spatial region and then to reproduce such, until the desired outer dimensions of the printed product are achieved.

In an advantageous further development of the method of the invention, the dimensions of the sensor element or the active component of the sensor element, are described via the outer shape. Alternatively, it is provided to describe the dimensions of a material block of the composite material via the outer shape. Then, a plurality of sensor elements or active components of the sensor element are formed from the block of material.

Examples of printing methods for 3D printing include especially:
a selective laser melting, or a selective laser sintering, which can be used when the at least two materials involve a metal and/or a plastic;
a fused deposition modeling or a multi-jet modeling, which can be applied, when the two materials both involve plastics.
a color jet printing (CJP), which can be applied, when at least one of the materials is a ceramic.

In an advantageous embodiment of the method of the invention, particles of the at least two materials are each blended into liquid media. The liquid media with the particles of the materials are printed in accordance with the predetermined material distribution. In such case, the printed composite material, or the printed sensor element, or the active component of the sensor element, is subjected to a sinter process. The sinter process follows the printing method preferably as a separate step, can, however, also likewise occur in parallel with the printing process.

Depending on the application, it can be very advantageous, when one of the materials is a material, which transfers in the case of a heating process into the gaseous phase, so that in the sensor element or in the active component of the sensor element a defined fraction of hollow spaces with defined geometry and size remains. Thus, it is possible to manufacture porous materials with precise hollow structures within the sensor element, or the component of the sensor element.

Considered especially favorable in connection with the invention is when the material distribution in the sensor element or in the active component of the sensor element is so calculated that the at least two materials are arranged in the sensor element or in the active component of the sensor element in defined complex microstructures (corresponding to the connection patterns). Preferably, the complex microstructures are, moreover, matched to the environmental conditions at the location of use of the field device.

As already mentioned above, produced via the method of the invention is either a material block of a composite material, or the product of the method of the invention is already the sensor element or active component of the sensor element.

Some examples will now be described:

A ceramic mass, which is embedded in a binding agent (adhesive means), is printed in a 3D printing method based on digital data corresponding to a predetermined outer shape. Additionally used for printing is a microbasis defined connection pattern. After the printing process or parallel with the printing process, the printed product is sintered. The sintering yields a composite skeleton, which can then be impregnated with a suitable polymer. However, the above described construction is not necessarily required. It can also be e.g. a porous ceramic of PZT, where pores of air or another gaseous material are enclosed as second phase in a ceramic. In the sense of the invention, air is likewise a phase.

In an additional example, two or more ceramic materials are used as printed materials. Both materials are printed in a 3D printing process. Especially, two or more active materials are processed for manufacturing the printed product. In this way, e.g. magnetostrictive and piezoelectric composite materials can be manufactured. A sensor element of the corresponding composite material is applicable e.g. in a magnetic field sensor. In the case of presence of a magnetic field, there occurs between two electrodes, which are arranged on oppositely lying outer surfaces of the sensor element, a voltage, which provides information concerning the strength of the magnetic field.

Furthermore, an option is to print a ceramic layer and to apply thereon a layer of a metal alloy. Ceramic and metal alloy have very different coefficients of expansion. Through a suitable change of the concentrations of the two materials in a transitional region, the transitional region can be embodied as an optimized adapting layer. If temperature fluctuations subsequently occur at the location of use of the component, then the two layers remain solidly connected with one another as a result of the optimized adapting layer.

Furthermore, the product manufactured via the method of the invention can be a $\lambda/4$ layer acting as a damping or coupling layer and printed on the housing (metal or plastic) of an ultrasonic sensor. Known from the state of the art are corresponding embodiments, wherein the connection region between the two components is a critical region.

According to the invention, the housing and coupling layer are produced in a 3D printing method, or in a generative printing method. Again, the optimal 3D structure of the acoustic sensor element is simulated and optimized. Via the method of the invention, printed products can be manufactured highly reproducibly with the appropriate functionality.

Used as damping layer are composites such as e.g. tungsten powder with epoxide resin. These materials can be manufactured readily with generative printing methods, or 3D-printing methods. The damping materials should absorb ultrasonic signals well; the contact locations between small particles of two phases with different acoustic properties are well suited for this.

Furthermore, the λ/4-layer can also be manufactured from a composite, in the case of which one of the phases is a gas, especially air. As a function of the porosity, the velocity of sound v and the density ρ of a material such as a plastic or metal can be varied as much as desired. In this way, the acoustic impedance ($Z=v*\rho$) of the λ/4-layer can be best matched to the medium.

For example, it is desired to couple an ultrasonic sensor composed of a piezoelectric composite acoustically to water. A piezocomposite has an acoustic impedance of about $18*10^6$ kg/($m^{2*}$s), and water has a density from about 1000 kg/$m^3$, the velocity of sound in water is about 1500 m/s. Thus, the acoustic impedance of the λ/4-layer of the ultrasonic transducer is $$Z(\lambda/4\text{-layer})=[Z(\text{water})*Z(\text{piezo})]^{1/2}=5.2*10^6 \text{ kg}/(m^{2*}s).$$

In order to achieve an optimal matching, a composite material with $Z=5.2*10^6$ kg/($m^{2*}$s) should be used as λ/4-layer.

Described in published German patent application DE 10 2014 114 016.8 filed 26 Sep. 2014 is how the optimal embodiment of the most varied of components suitable for automation technology can be ascertained and manufactured. Especially, the components are of porous material. The corresponding passages of this parallelly filed German patent application are explicitly included in the disclosure of this solution of the invention.

BRIEF DESCRIPTION OF THE DRAWINGS

The invention will now be explained in greater detail based on the appended drawing, the figures of which show as follows:

FIG. 3b is a sensor element of the invention composed preferably of the composite material of FIG. 3a.

DETAILED DISCUSSION IN CONJUNCTION WITH THE DRAWINGS

Figure 1:
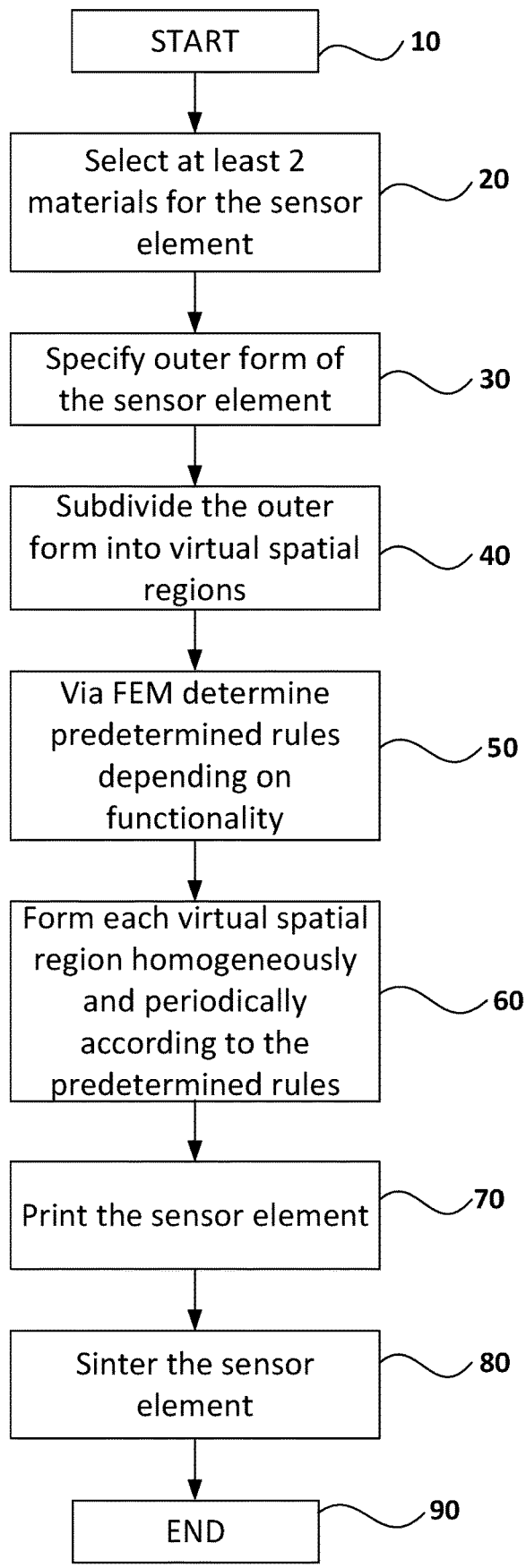
FIG. 1 is a flow block diagram illustrating a preferred embodiment of the method of the invention.

Fig. 1 shows a flow diagram illustrating a preferred embodiment of the method of the invention. After starting at point 10, at point 20 at least two materials are selected, which are suitable for manufacture of the sensor material or the active component of the sensor element. At point 30, the outer shape, thus the outer dimensions, of the sensor element, or the active component of the sensor element, are specified, i.e. predetermined. At point 40, a virtual subdividing of the outer shape of the sensor element, or the active component of the sensor element, into virtual spatial regions is performed. At point 50, predetermined rules are created by means of a finite elements model FEM depending on the functionality of the sensor element or the active component of the sensor element. Then at point 60, each virtual spatial region is embodied homogeneously and periodically according to the predetermined rules ascertained via the finite elements model FEM.

The corresponding digital data are transmitted to a 3D printer and correspondingly printed (point 70). At point 80, the sensor element, or the active component of the sensor element, is sintered. Point 70 and point 80 can, in given cases, also be executed simultaneously, or always directly following one another, and, indeed, until the sensor element, or the active component of the sensor element, is complete as regards the predetermined dimensions (point 90).

Figure 2:
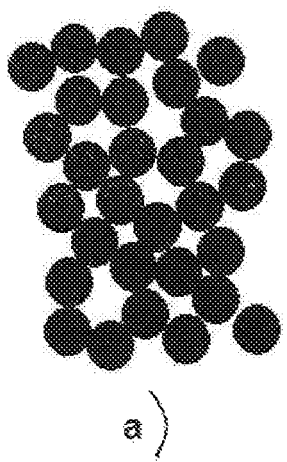
FIG. 2 are schematic representations of composite material,
a) wherein all three dimensions are less than the manufactured printed product
b) wherein two dimensions are less than the manufactured printed product
c) wherein one dimension is less than the manufactured printed product.
Figure 2:
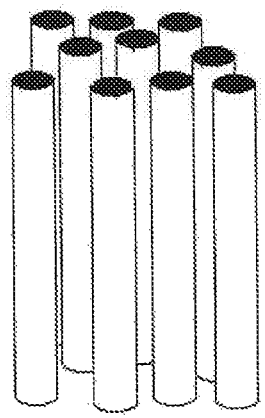
Figure 2:
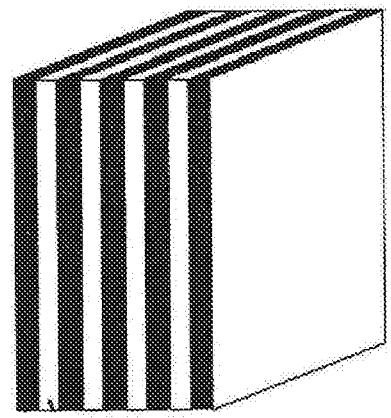
Figure 2:
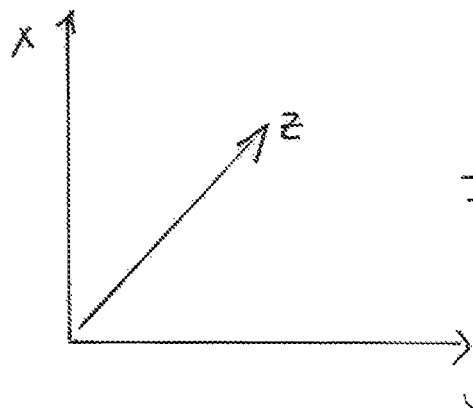

FIG. 2 shows schematic representations of a composite material,
a) wherein all three dimensions of the microstructure are less—here by a factor of 5—than the printed product manufactured of the composite material;
b) wherein two dimensions of the microstructure are significantly less than the completed printed product. The remaining dimension is comparable with the dimensions of the printed product.
c) Wherein one dimension of the microstructure is less than the completed printed product. The two other dimensions are comparable with the dimensions of the printed product.

The terminology, printed product, is, in such case, the generic expression for composite material with defined outer dimensions, sensor element or active component of the sensor element, as the case may be.

Figure 3A:
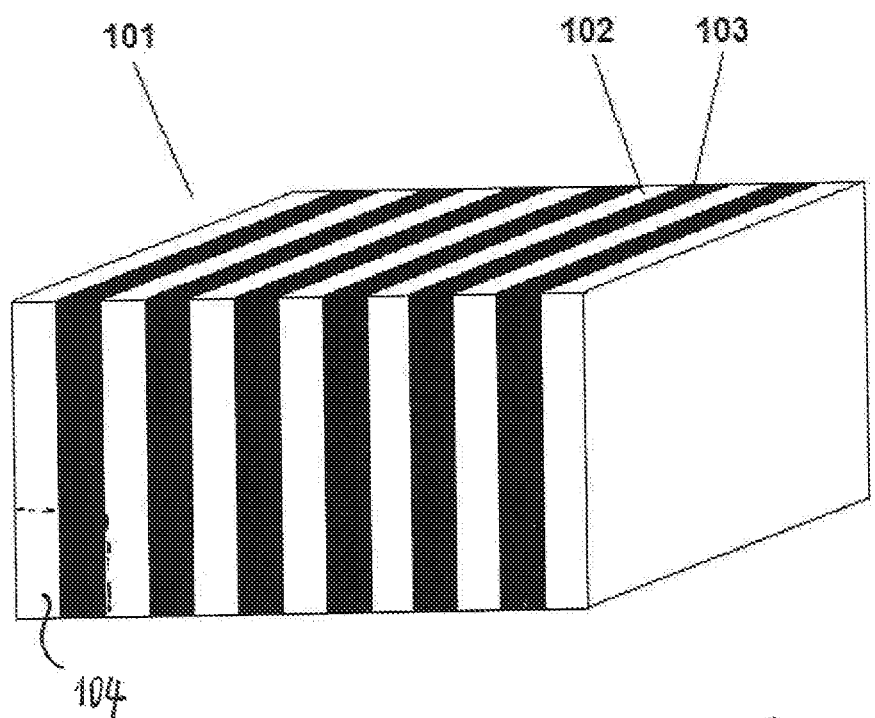
FIG. 3a is a composite material of the invention composed of a piezoelectric material and a magnetostrictive material.

FIG. 3a shows a composite material 101 of the invention. Composite material 101 is composed of a piezoelectric ceramic material 102 and a magnetostrictive ceramic material 103, which are connected layer-wise with one another. A virtual spatial region is indicated with the reference character 104. For example, the piezoelectric ceramic material 102 is PZT5 (lead-zirconate-titanate) and the magnetostrictive ceramic material 103 is cobalt-nickel ferrite. Both materials 102, 103 are dielectric materials.

After 3D printing corresponding to the method of the invention, the composite material 101 is sintered at temperatures from 1150-1300° C. Subsequently, the composite material can be processed further to sensor elements 201 or to active components 201 of sensor elements. The further processing occurs, for example, via mechanical methods or via laser methods.

Figure 3B:
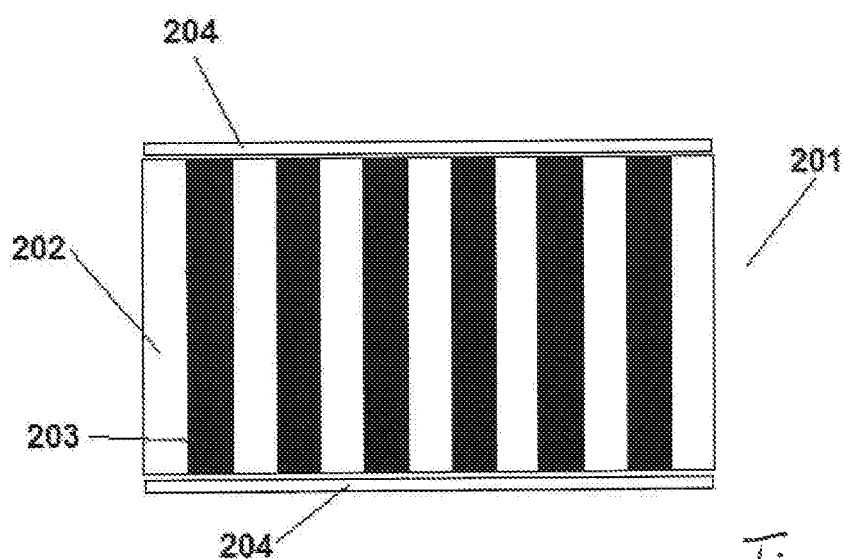

FIG. 3b shows a sensor element 201, which is manufactured from the composite material 102, 103 illustrated in FIG. 3a, which, however, can also be manufactured from another composite material with other materials 202, 203. Sensor element 201 includes two oppositely lying, metal electrodes 204. The electrodes 204 are e.g. fired silver layers with a thickness of 2-10 μm, or sputtered gold, silver, copper, nickel or another conductive metal or another conductive alloy. After polarizing the piezoelectric ceramic material 102, 202, e.g. PZT5, by applying an electrical direct voltage field of about 1 MV/m to the electrodes 204, the piezoelectric ceramic layer material 102, 202 acquires permanent piezoelectric properties. The layers of the two materials 102, 103, or 202, 203, are bonded together as a result of the manufacturing process.

An above described sensor element 201, or composite material 101, can be used e.g. in a sensor for determining the strength of a magnetic field. If the sensor element 201 is placed in a magnetic field, then the layers of magnetostrictive ceramic material 103, 203 exert a mechanical stress on the layers of piezoelectric, ceramic material 102, 202. As a result of the mechanical stress, an electrical charge occurs on the electrodes 204 to serve as measurement signal for the evaluation of the magnetic field.

Figure 4A:
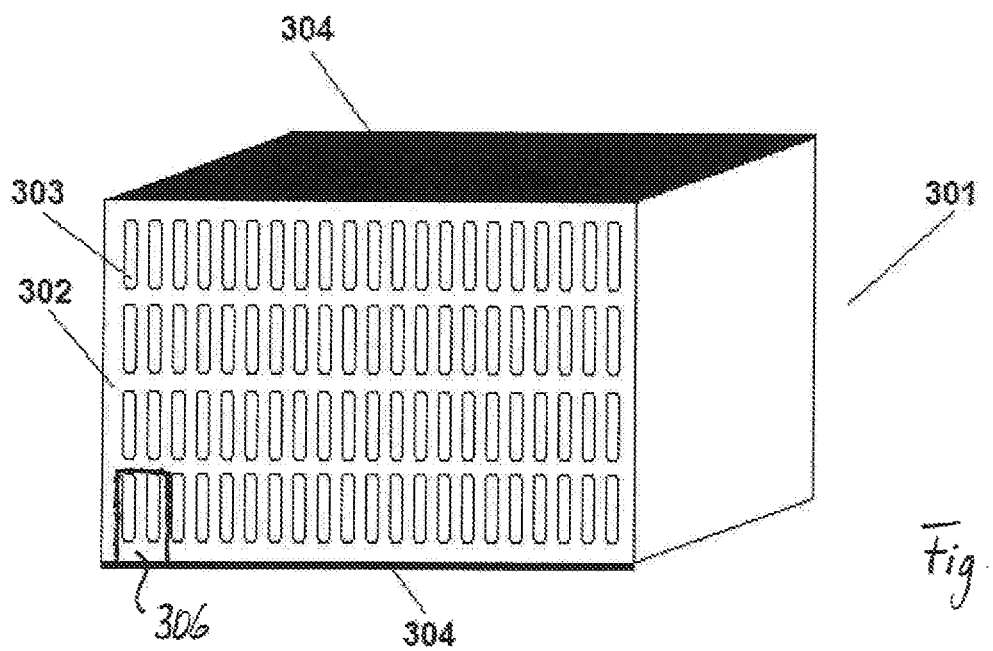
FIG. 4a is a sensor element of the invention composed of a porous piezoelectric ceramic composite material with a first defined material distribution.
Figure 4B:
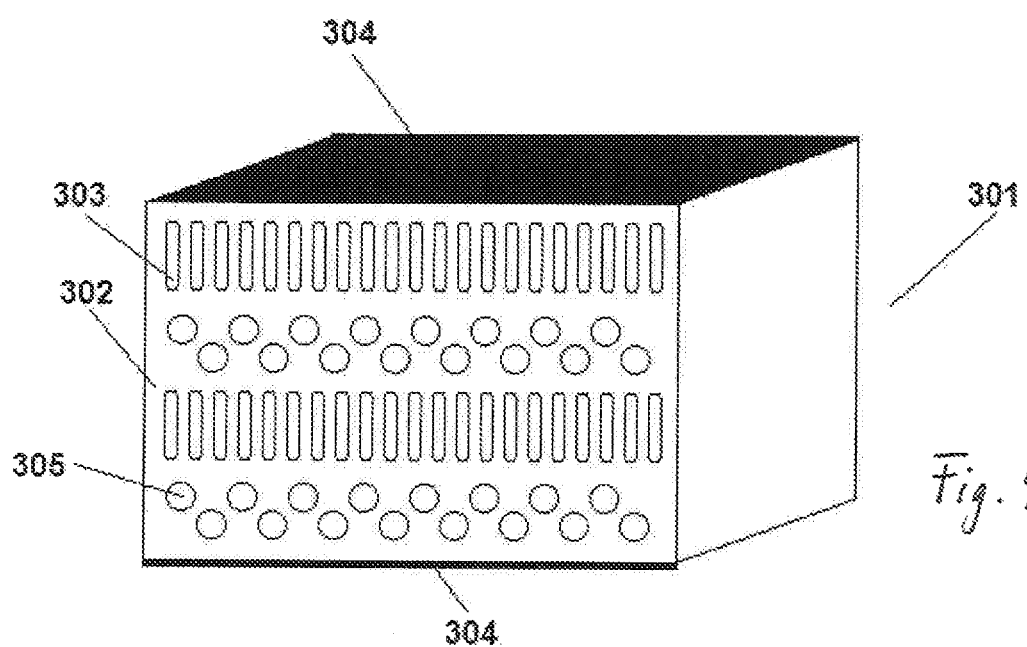
FIG. 4b is a sensor element of the invention composed of a porous piezoelectric ceramic composite material with a second defined material distribution.

FIG. 4a shows a sensor element of the invention 301, which is composed of a piezoelectric ceramic material 302 with defined air inclusions 303. For example, the piezoelectric material 302 is a material based on PZT basis. The piezoelectric properties of porous piezo elements depend very strongly on pore geometry and pore distribution in the ceramic matrix. FIGS. 4a and 4b illustrate two different pore distributions and pore geometries in a piezoelectric element (active element of a sensor element) of PZT 302. FIG. 4a shows a piezoelectric element 301 with rod shaped pores 303 in the PZT material 302, while the piezoelectric ceramic 302 of FIG. 4b has rod shaped pores 303 and sphere shaped pores 305, which are arranged in a defined pattern relative to one another. The porous piezoelectric material is after sintering at 1150-1300° C. mechanically worked to the desired shape and coated with metal electrodes 304. Then, the sensor element 301 with electrodes is polarized in a direct voltage field of about 1 MV/M.

Correspondingly manufactured, porous, piezoelectric sensor elements 301, or active components 301 of sensor elements, possess a high hydrostatic sensitivity and can be used as microphone- or hydrophonic sensors. Using the manufacturing process of the invention, the pore geometry and the pore distribution can be created exactly according to mathematical simulations (e.g. by means of FEM). This enables the reproducible manufacturing of piezoelectric sensors 301 with exactly defined properties. In such case, sensor elements 301 or active components 301 of sensor elements can be formed with highly periodic or, however, also with aperiodic, pore distributions. Of course, it is also possible to implement any pore distribution in the piezoelectric element 301, such that the piezoelectric element 301 has the desired physical and/or chemical properties.

The invention claimed is:

1. A method for manufacturing a senor element or an active component of a sensor element, wherein said sensor element is applied in a field device of automation technology, for registering or monitoring a process variable of a medium, comprising the steps of:
predetermining at least two materials having different physical and chemical properties depending on a functionality of said sensor element or the active component of said sensor element;
predetermining a shape into which the at least two materials are to be formed the shape being divided into a plurality of virtual spatial volumes, wherein in each virtual spatial volume a distribution of said at least two materials includes periodic, homogenous regions of each of said at least two materials, which define a composite material configured into a microstructure according to predetermined rules;
ascertaining the predetermined rules via a computer supported method depending on the predetermined functionality of said sensor element or the active component of said sensor element;
transferring digital data, which describe said ascertained distribution of said at least two materials, to at least one 3D printer; and
manufacturing as a printed product said sensor element or the active component of said sensor element by the 3D printer based on the digital data
wherein, in each virtual spatial volume as manufactured, physical and chemical properties of the composite material comprising the microstructure differ from the as-manufactured physical and/or chemical properties of said at least two materials individually.

2. The method as claimed in claim 1, wherein:
the dimensions of a virtual spatial volume manufactured via 3D printing are so selected that the physical and chemical properties of each virtual spatial volume correspond to the physical and/or chemical properties of said sensor element or the active component of said sensor element.

3. The method as claimed in claim 1, wherein:
the dimensions of each virtual spatial volume of said element or active component of said sensor element manufactured via the 3D printing are less by at least a factor of greater than/equal to 5, preferably a factor of greater than/equal to 10, than the dimensions of said printed sensor element, or the active component of said sensor element.

4. The method as claimed in claim 1, wherein:
the dimensions of said sensor element or the active component of said sensor element are described via the outer shape.

5. The method as claimed in claim 1, wherein:
the dimensions of a material block are described via the outer shape; and
a number of sensor elements or active components of said sensor element are formed from the material block.

6. The method as claimed in claim 1, wherein:
a selective laser melting, or a selective laser sintering, is used as 3D printing method for the case, in which at least a first one of said two materials is a metal and/or a second one of said two materials is a plastic.

7. The method as claimed in claim 1, wherein:
a fused deposition modeling or a multi jet modeling is used as the 3D printing method for the case, in which at least a second one of said two materials is a plastic.

8. The method as claimed in claim 1, wherein:
a color jet printing (CJP) is used as 3D printing method for the case, in which at least a second one of said at least two materials is a ceramic.

9. The method as claimed in claim 1, wherein:
particles of said at least two materials are each blended into liquid media, the liquid media with the particles of the materials are printed in accordance with the predetermined material distribution; and
the printed material block, or the sensor element or the active component of said sensor element, is subjected to a sinter process.

10. The method as claimed in claim 1, wherein:
used as one of the at least two materials is a material, which transfers in the case of a heating process into the gaseous phase, so that in said sensor element or in the active component of said sensor element a defined fraction of hollow spaces with defined geometry and size remains.

11. The method as claimed in claim 1, wherein:
the material distribution in said sensor element or in the active component of said sensor element is so calculated that said at least two materials are arranged in said sensor element or in the active component of said sensor element in defined microstructures.

12. The method as claimed in claim 11, wherein:
the microstructures are matched to the environmental conditions at the location of use of the field device.

13. The method as claimed in claim 1, wherein:
one of said at least two materials is a piezoelectric ceramic material, and one of said at least two materials is a material that transitions into a gaseous phase upon heating such that, as manufactured, in said sensor element or in the active component of said sensor element a defined fraction of hollow spaces with defined geometry and size remains.

* * * * *